United States Patent [19]

Vandorpe

[11] Patent Number: 4,996,491
[45] Date of Patent: Feb. 26, 1991

[54] MEASUREMENT OF THE POSITION OF AN ELONGATED ELEMENT

[75] Inventor: John Vandorpe, Zulte, Belgium

[73] Assignee: N.V. Bekaert S.A., Zwevegem, Belgium

[21] Appl. No.: 363,259

[22] Filed: Jun. 7, 1989

[30] Foreign Application Priority Data

Jul. 19, 1988 [EP] European Pat. Off. ........ 88201564.7

[51] Int. Cl.$^5$ ............................................ G01N 22/00
[52] U.S. Cl. .................................... 324/644; 324/645
[58] Field of Search ............... 324/644, 645, 646, 642, 324/637

[56] References Cited

U.S. PATENT DOCUMENTS

| | | | |
|---|---|---|---|
| 2,494,570 | 1/1950 | Mezger | 315/58 |
| 2,596,529 | 5/1952 | Clarke | 324/644 X |
| 2,596,530 | 5/1952 | Clarke | 324/644 X |
| 2,617,853 | 11/1952 | Gilmer | 324/645 |
| 3,634,756 | 1/1972 | Carlise | 324/644 |
| 3,796,949 | 3/1974 | Banning | 324/645 |
| 3,810,004 | 5/1974 | Henoch | 324/58.5 R |
| 3,973,259 | 8/1976 | Hellgren et al. | 343/7.5 |
| 4,045,727 | 8/1977 | Yu et al. | 324/644 |
| 4,359,683 | 11/1982 | Chivers | 324/644 |

FOREIGN PATENT DOCUMENTS 2251011 6/1975 France.
2373820 7/1978 France.

OTHER PUBLICATIONS

G. Biezunski, "Du Monde Entier de Pologne: Utilisation des Hyperfreqhences en Instrumentation, Mesures Regulation Automatisme," vol. 35, nr. 1/2, Jan./Feb. 1970, pp. 122-126.

Primary Examiner—Reinhard J. Eisenzopf
Assistant Examiner—Robert W. Mueller
Attorney, Agent, or Firm—Foley & Lardner, Schwartz, Jeffery, Schwaab, Mack, Blumenthal & Evans

[57] ABSTRACT

The linear position of an elongated element (1) is measured using a transmission medium (2). The transmission medium comprises an emitter (3) of microwaves and a receiver (4) of microwaves and has at its one end the elongated element (1) and at its other end an electrical short-circuit (23). An asymmetrical sawtooth standing wave with substantially linear flanks is generated by reflection of the microwaves on the short-circuit (23) and on the elongated element (1). The position of the elongated element is determined by measuring the amplitude of the longer flank of the standing wave with the receiver. The method may be used in difficult circumstances and is suitable to measure mechanical vibrations of high-frequency.

7 Claims, 2 Drawing Sheets

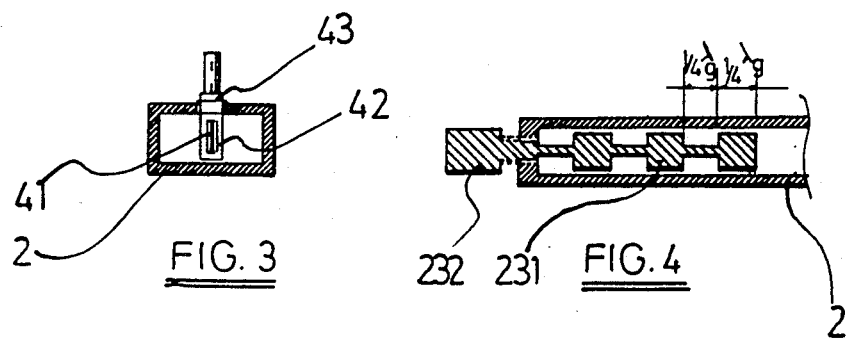
FIG. 3
FIG. 4
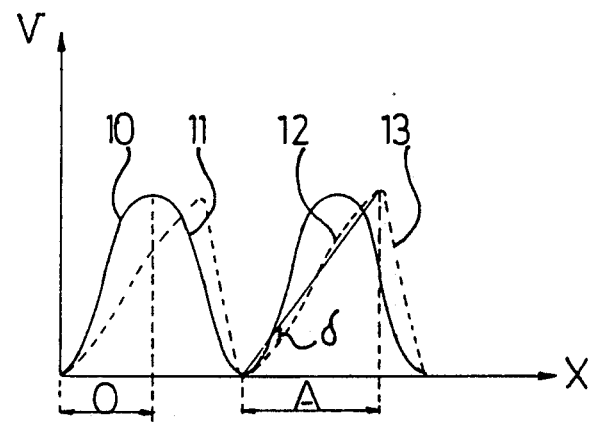
FIG. 5
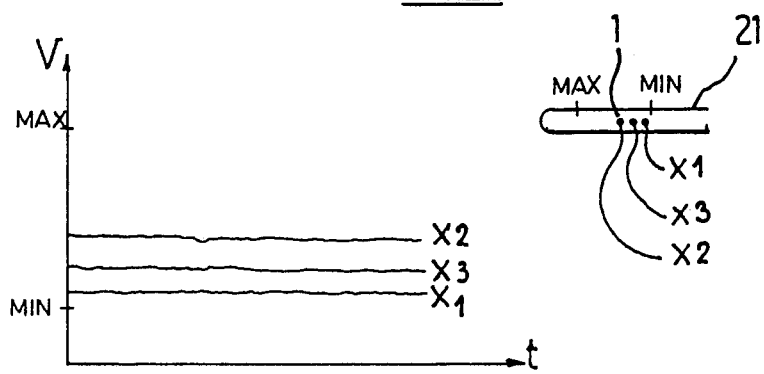
FIG. 6
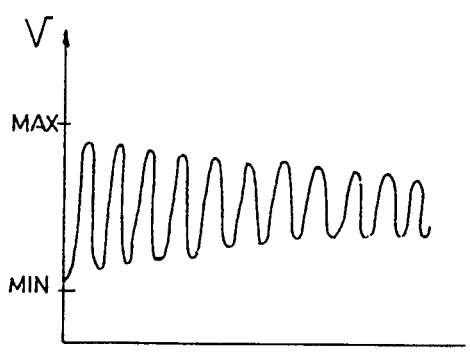
FIG. 7

MEASUREMENT OF THE POSITION OF AN ELONGATED ELEMENT

BACKGROUND OF THE INVENTION

The invention relates to a method and apparatus for measuring the linear position of an elongated electrically conductive element.

The term "linear position" of an elongated element refers to the position of the elongated element in a direction which is perpendicular to the longitudinal axis of the elongated element. By "elongated element" is meant an element whose longitudinal dimensions are more than hundred times the dimensions of its cross-section.

The term "electrically conductive element" refers to an element which has a conductivity coefficient which is greater than 0.01 mm/$\Omega$mm$^2$. Copper wires, steel filaments and stainless steel fibres are examples of elongated electrically conductive elements.

BRIEF DESCRIPTION OF RELATED ART

While processing an elongated element, such as a steel wire, it is often desirable to know the exact position or the exact vibrations of the elongated element during its processing.

Analysis of this position or of these vibrations may indicate the quality of the process or the wear of some parts of the machinery. If one wishes to obtain values of this position or of these vibrations which are suitable for the analysis one wants to make, these variable quantities must be measured at a strictly determined point in the process line and very often this point in the process line imposes severe restrictions to the measurement methods and apparatuses and even makes measurement impossible in some extreme cases. In fact, accurate measurement of the position or the vibrations of a steel wire is hardly possible by the use of conventional techniques in a furnace of 900° C., above a bath for thermal treatment where the temperature is higher than 250° C. or in high vacuum.

Another drawback of conventional techniques is that they are limited in frequency of the vibrations. High harmonics are difficult or impossible to measure.

Still another drawback of some conventional techniques such as inductive methods is that only the speed or, in an indirect way, the position of a moving elongated element is measured. At standstills no detection signal is produced.

OBJECTS AND SUMMARY OF THE PRESENT INVENTION

It is an object of the present invention to measure the position and the vibration of an elongated element in difficult circumstances.

It is another object of the present invention to allow the accurate measurement of high-frequency vibrations of an elongated element.

It is still another object of the present invention to measure the absolute position of an elongated element, i.e. the rest position of an elongated element.

According to one aspect, the present invention provides a method for measuring the linear position of an elongated electrically conductive element characterized in that a transmission medium is used. The transmission medium is comprised by a microwave circuit having an emitter of microwaves and a receiver of microwaves, and the transmission medium has at its one end the elongated element and at its other end, an electrical short-circuit. The method is characterized in that a standing wave is generated by the reflection of the microwaves on the short-circuit and on the elongated element and the position of the elongated element is determined by measuring, by means of receiver, the amplitude of the standing wave.

The other end of the transmission medium with the short-circuit is located at about $k.\frac{1}{2}\lambda g$ from the emitter, k being an integer number greater than or equal to one and $\lambda g$ being the wavelength of the microwaves in the wave guide.

The transmission medium may be a wave guide, a stripline, a microstrip or other devices which are well known in the art. What form is used depends on the circumstances under which the linear position has to be measured. At high temperatures a wave guide made of a suitable material must be used. If the measurement imposes no specific requirements, then a stripline or a microstrip is preferred for reasons of cost.

Preferably, if a wave guide is used, it has at its one end two slots to allow passage of the elongated element. The slots must be sufficiently broad to allow free movement of the elongated element and on the other hand sufficiently narrow to limit, as much as possible, disturbances to the field distribution of the microwaves.

The receiver is conveniently connected via an analog-to-digital (ADC) convertor to a processing unit. The measured data may be mathematically processed in real time and/or may be stored in a memory for later analysis, such as e.g. Fourrier analysis and Fast Fourrier Transformation (FFT) analysis.

If a wave guide is used, the cross-section of the wave guide may be circular or elliptic. In such a case the microwaves are circularly or elliptically polarized. In a preferable way of carrying out the invention, the wave guide has a rectangular cross-section and the microwaves are linearly polarized, i.e.: the electrical field E has a direction which is substantially parallel to the direction of the elongated element. In this way the measurement system reaches its highest sensitivity.

In a most preferable way of carrying out the invention, the electrical short-circuit is a movable short. This is a known device for realizing a short-circuit. This movable short is so adjusted—with the elongated element present at the one end of The wave guide—that it creates a standing wave which has a saw tooth form with for each half-period two substantially linear flanks, i.e. flanks with a maximum deviation of 10–15 per cent from perfect linearity. One flank is longer than the other one, and the measurement of the amplitude is carried out on the longer one.

According to a second aspect of, the present invention provides an apparatus for measuring the linear position of an elongated electrically conductive element characterized in that said apparatus comprises a wave guide having an emitter of microwaves and a receiver of microwaves. The wave guide has at its one end two slots to allow passage of said elongated element and at its other end an electrical short-circuit. The other end located at, $k.\frac{1}{2}\lambda_g$ from said emitter, with k being an integer number greater or equal than one and $\lambda_g$ being the wavelength of microwaves in the waveguide.

The wave guide may have a circular or elliptic cross-section, but preferably has a rectangular cross-section.

The wave guide may be made of several materials such as aluminium or stainless steel. However, if the apparatus is used to measure the position or the vibrations of an elongated element in a furnace, the wave guide is preferably made of molybdenum.

BRIEF DESCRIPTION OF THE DRAWINGS

A preferred embodiment of the invention will now be described with reference to the accompanying drawings wherein

FIG. 3 is a cross-section of a wave guide along the plane III—III of FIG. 1;

FIG. 4 is a cross-section of a movable short in the wave guide along the plane IV—IV of FIG. 1;

FIG. 5 is a diagram of the measured voltage in function of the position of the elongated element;

FIG. 6 and FIG. 7 are diagrams of the measured voltage in function of the time.

DETAILED DESCRIPTION OF THE PREFERRED EMBODIMENTS

Figure 1:
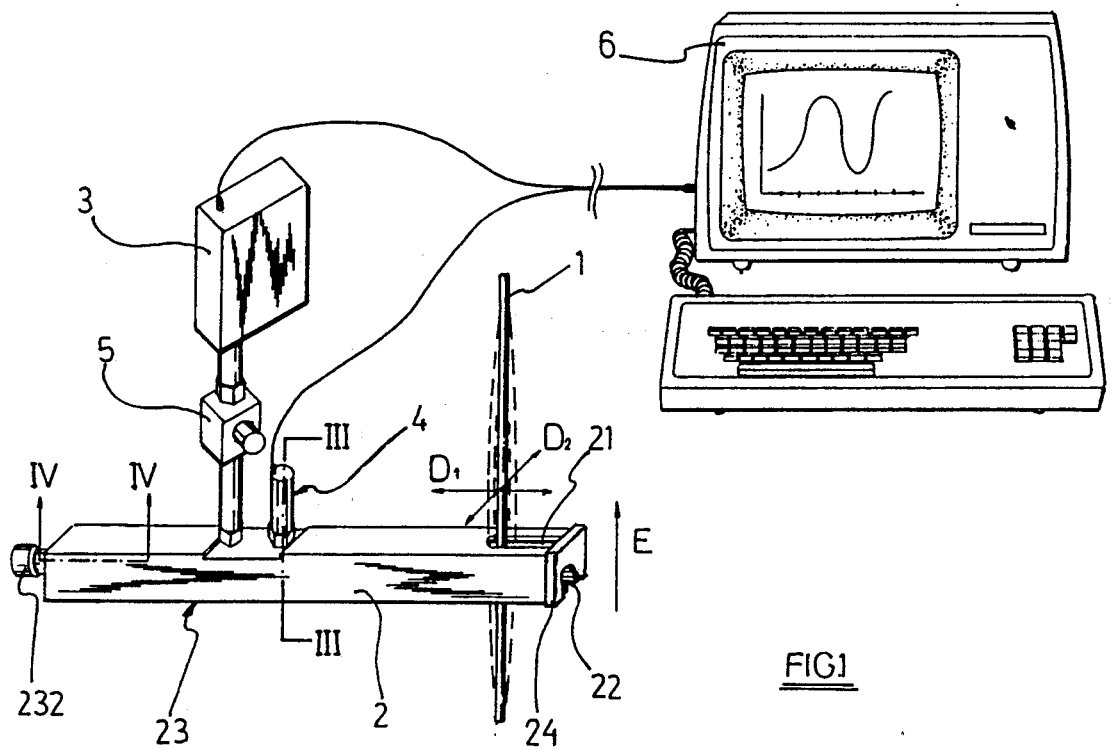
FIG. 1 and FIG. 2 show a global view of a measurement system according to the invention.

FIG. 1 shows a global view of the measurement system according to the invention. The elongated element is a metal wire 1. The system detects the position of the wire 1 in a direction $D_1$. Vibrations or position changes in a direction $D_2$ are not detected. A wave guide 2 is used as transmission medium and has at its one end two elongated slots 21, 22 which allow passage of the wire 1. This one end may be provided with an absorber 24 (only partly shown in FIGS. 1 and 2) in order to limit interference with other waves from the environment. At its other end there is an electrical short-circuit 23. The wave guide 2 has a rectangular cross-section. This is to be preferred because of simplicity of construction and because a rectangular cross-section permits linear polarization. An emitter of microwaves 3, e.g. a gunn-diode, is connected via an insulator 5 to the wave guide 2. The insulator 5 prevents the energy from being reflected to the emitter 3.

The detection apparatus also comprises a receiver of microwaves 4, e.g. a Schottky diode.

Both emitter 3 and receiver 4 are connected to a processing unit. In FIG. 1 the processing unit is a personal computer 6.

Figure 2:
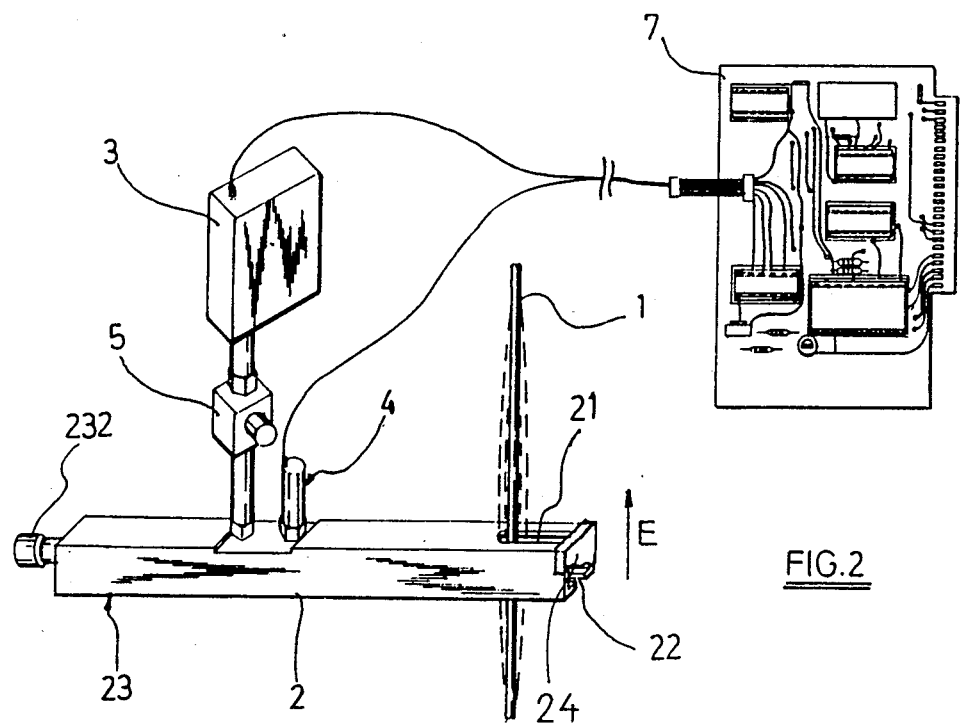

FIG. 2 shows the same global view of the measurement system according to the invention, but here the processing unit is a print 7 with printed circuits and IC's suitable to process and store the measured data.

FIG. 3 shows a cross-section of the wave guide along the plane III—III of FIG. 1. The detector 41 of the receiver 4 is surrounded by a plastic cylinder 42 in order to make the construction more stable. A coaxial connection 43 connects the detector 41 with the rest of the receiver 4.

Preferably, the electrical field E is parallel to the elongated element. This gives the most sensitive measurements and the two slots 21 and 22 cause the smallest disturbances to the field distribution. Because of reasons of sensitivity, the detector 41 is also preferably parallel to the electrical field E.

FIG. 4 is a cross-section of a short-circuit at the end 23 of the wave guide 2 along the plane IV—IV of FIG. 1. This short-circuit is a movable short 231 comprising subsequent cylindrical pieces, each having a length of $0.25 \times \lambda_g$. A thinner cylindrical piece follows a thicker one, and vice versa. The position of the movable short 231 along the wave guide 2 may be adjusted manually by turning the knob 232.

Theoretically, a standing wave pattern is only possible if the short-circuit, in this case the movable short 231, is located at $k \times 0.5 \times \lambda_g$ from the emittor 3 of microwaves, k being an integer number greater than or equal to one. One period of a theoretical standing wave pattern is represented in full lines on FIG. 5, where V is the amplitude of measured voltage and X the axial position along the wave guide 2. Each period of the theoretical standing wave pattern has two maxima and on each side of each maximum there are two non-linear flanks (10, 11). A measurement of the position of the wire 1 is only possible over maximum $0.25 \times \lambda_g$ (indicated by range 0 in FIG. 5).

The inventor has now discovered that by changing slightly the position of the movable short 231 along the wave guide 2 a standing wave pattern may be obtained having a saw tooth form with two substantially linear flanks (12, 13), the one being longer than the other one. This standing wave pattern is represented in FIG. 5 by a dash line. The maximum deviation δ from perfect linearity is 10 to 15 per cent. Hence, this standing wave pattern has two advantages to the theoretical standing wave pattern:

(1) better linearity
(2) a maximum range A for measurement of the position of the wire 1 which is larger than $0.25 \times \lambda_g$.

Suitable software may remove the remaining unlinearities. Autoscaling and drift compensation are other possible functions of the software.

As a matter of example some tests have been carried out. The cross-section of the wave guide is rectangular 22.86 mm by 10.16 mm. Microwaves are emitted through the wave guide in a $TE_{1,0}$-mode at a frequency of 7.7 GHz. This corresponds to a wave length in the wave guide $\lambda_g$ of 74.27 mm. Accordingly, the range for measuring the wire position is about 18.57 mm. Two wire positions which correspond to a minimum (MIN) and a maximum (MAX) value of the measured voltage (voltage measured with the wire at these positions in the slot) are marked on the slot 21.

TEST 1

A wire is positioned in rest at $X_1$ between the two extreme positions MIN and MAX. The measured voltage is recorded during a period of some seconds. The same is repeated for the wire at position $X_2$ and at position $X_3$ between $X_1$ and $X_2$.

FIG. 6 shows the measured voltage in function of the time t for the three cases. As can be seen a substantially constant value is detected in the three cases. This constant value unambiguously indicates the position of wire 1 in the slots 21 and 22.

TEST 2

A wire 1 is again positioned in rest somewhere in the middle between the two extreme positions MIN and MAX. The wire is pulled out of its rest position by hand and relieved and the measured voltage is again recorded during a period of some seconds. FIG. 7 shows this measured voltage in function of the time t. The curve corresponds to the well known curve of an underdamped second-order system.

It must be clear that the system according to the present invention is able to measure the position and the vibration of an elongated element in difficult circumstances. Indeed, the sensors are located at a certain distance from the elongated element and, consequently, are not necessarily subjected to the same severe conditions such as high temperature or vacuum as the elongated element is.

In view of the frequency range of microwaves (from 1 GHz to 100 GHz) no theoretical limitations are imposed on the maximum frequency of mechanical vibrations to be measured. In fact, the only limitations are imposed by the signal conversion.

As an extension of the system according to the invention as explained above the position and vibrations of an elongated element could be measured in different directions by the use of two wave guides which form an angle of 90° (degrees). Similarly it would be possible to measure the diameter of an elongated element with a round cross-section by the use of several wave guides which form a specified angle between each other.

I claim:

1. A method for measuring the linear position of an elongated electrically conductive element, comprising the steps of:

(1) providing a transmission medium, the transmission medium comprising a microwave circuit having an emitter of microwaves and a receiver of microwaves, the medium having a pair of ends, the elongated element being positioned at a first end and a movable short being positioned at a second end;

(2) generating an asymmetrical standing wave by reflecting microwaves on the movable short and on the elongated element, the standing wave having a saw-tooth form with two substantially linear flanks, one flank being longer than the other; and (3) determining the position of the elongated element by measuring with the receiver the amplitude of the longer flank.

2. A method according to claim 1, wherein the second end is located at a distance approximately equal to $k\frac{1}{2}\lambda g$ from the emitter, where k is an integer number greater than or equal to one end $\lambda g$ is the wavelength of the microwaves.

3. A method according to claim 1, wherein the transmission medium is a stripline.

4. A method according to claim 1, wherein the transmission medium is a waveguide.

5. A method according to claim 4, wherein the waveguide has a pair of slots at its first end for allowing passage of the elongated element.

6. A method according to claim 4, wherein the waveguide has a rectangular cross section and the microwaves are linearly polarized in a direction substantially parallel to the direction of the elongated element.

7. A method according to claim 1, wherein the elongated element is a steel wire.

* * * * *